United States Patent
Isenburg

(10) Patent No.: US 6,741,470 B2
(45) Date of Patent: May 25, 2004

(54) REUSABLE THERMAL SOLUTION ATTACHMENT MECHANISM AND METHODS OF USING SAME

(75) Inventor: Thomas A. Isenburg, Oakley, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/872,628

(22) Filed: Jun. 1, 2001

(65) Prior Publication Data

US 2002/0181206 A1 Dec. 5, 2002

(51) Int. Cl.[7] .................................................. H05K 7/20
(52) U.S. Cl. ...................... 361/704; 361/692; 361/702; 361/707; 257/718; 165/80.3
(58) Field of Search ................................ 361/702–704, 361/717–721, 722, 829; 257/706–727; 165/80.2, 80.3, 80.4, 185, 121–124; 174/16.3; 439/71, 73, 79, 66, 526, 331

(56) References Cited

U.S. PATENT DOCUMENTS

| | | | |
|---|---|---|---|
| 4,712,159 A | 12/1987 | Clemens | 361/386 |
| 4,933,746 A | 6/1990 | King | 357/81 |
| 4,964,198 A | 10/1990 | McCarthy | 24/458 |
| 5,132,875 A * | 7/1992 | Plesinger | 361/386 |
| 5,313,099 A | 5/1994 | Tata et al. | 257/717 |
| 5,397,919 A | 3/1995 | Tata et al. | 257/717 |
| 5,662,163 A * | 9/1997 | Mira | 165/80.3 |
| 5,667,870 A | 9/1997 | McCullough | 428/131 |
| 5,699,229 A | 12/1997 | Brownell | 361/719 |
| 5,730,620 A * | 3/1998 | Chan et al. | 439/526 |
| 5,770,891 A * | 6/1998 | Frankeny et al. | 257/727 |
| 5,774,335 A | 6/1998 | Pare et al. | 361/704 |
| 5,784,257 A | 7/1998 | Tata | 361/704 |
| 5,825,622 A | 10/1998 | Rife et al. | 361/704 |
| 5,883,782 A | 3/1999 | Thurston et al. | 364/704 |
| 5,919,050 A * | 7/1999 | Kehley et al. | 439/71 |
| 5,945,736 A | 8/1999 | Rife et al. | 257/19 |
| 6,014,315 A * | 1/2000 | McCullough et al. | 361/704 |
| 6,021,045 A | 2/2000 | Johnson | 361/704 |
| 6,046,905 A | 4/2000 | Nelson et al. | 361/704 |
| 6,061,239 A | 5/2000 | Blomquist | 361/704 |
| 6,075,699 A | 6/2000 | Rife | 361/704 |
| 6,093,961 A | 7/2000 | McCullough | 257/718 |
| 6,097,602 A | 8/2000 | Witchger | 361/705 |
| 6,201,697 B1 | 3/2001 | McCullough | 361/704 |
| 6,404,634 B1 * | 6/2002 | Mann | 361/704 |
| 6,459,582 B1 * | 10/2002 | Ali et al. | 361/704 |

FOREIGN PATENT DOCUMENTS

| | | | | |
|---|---|---|---|---|
| EP | 0637079 A1 * | 1/1995 | | H01L/23/40 |
| WO | WO 02/13265 A2 * | 2/2002 | | H01L/23/40 |

OTHER PUBLICATIONS

"Chip Coolers—New Technology", *ChipCoolers, Inc.*, www.chipcoolers.com/newtech.stm, (Published prior to Jun. 1, 2001), 1 pg.

* cited by examiner

*Primary Examiner*—Michael Datskovsky
(74) *Attorney, Agent, or Firm*—Schwegman, Lundberg, Woessner & Kluth, P.A.

(57) ABSTRACT

A reusable thermal solution attachment system that provides a quick and easy method for securing and removing a thermal solution from a circuit board without the use of tape, adhesives or fasteners. In one embodiment, the system includes two plates and a set of locking pins to secure the circuit board between the plates. The resulting mechanism is easy to attach and remove during testing operations or can be permanently installed in desktop environments.

41 Claims, 10 Drawing Sheets

REUSABLE THERMAL SOLUTION ATTACHMENT MECHANISM AND METHODS OF USING SAME

FIELD

This invention relates generally to thermal solution attachment mechanisms, and in particular, the present invention relates to a reusable thermal solution attachment mechanism and methods of using same.

BACKGROUND

During manufacturing of microprocessors, a basic system or circuit board function test is typically performed prior to system assembly. As testing proceeds, the central processing unit (CPU or processor) heats up, thus requiring temporary processor cooling. Such cooling, even for a limited time, is critical to successful operation of the processor. Natural convection provided by the open air environment of the manufacturing setting aids in cooling, but additional cooling means are usually needed. Most often, a thermal solution is also used to cool the CPU by reducing thermal resistance between the thermal solution and the surface of the die, i.e., the unpackaged processor. Thermal solutions are also designed to provide mechanical pressure on the processor, in order to improve thermal performance.

In the mobile environment, most manufacturers secure temporary thermal solutions to the die surface with thermal tape or adhesives. In mobile processors that require only 15 to 18 watts of power to be drawn off near a temperature of about 100° C., such methods have been relatively successful in keeping the processor adequately cooled. However, thermal tape and adhesives are often not reusable and can leave residual material on the die surface.

Another method involves placing the thermal solution on top of the package, allowing the weight of the components to provide the requisite pressure to the processor contained within. However, the applied pressure with this method is not always consistent and is oftentimes inadequate.

Temporary fasteners are also not a practical option in most instances as they are difficult to attach and remove quickly during manufacturing, particularly with the smaller components used in mobile applications. Additionally, clips or fasteners that attach directly to a CPU package rather than to the circuit board, can easily damage or pinch the processor. Such a configuration may also pull the processor away from the circuit board surface, possibly hampering the integrity of the solder joint between the package and circuit board. For socket mounted packages, the use of such clips may also require redesign of the socket itself.

As processing power increases, heat generated by the processor increases. Recently developed mobile applications use processors requiring 30 watts or more of power to be drawn off near a temperature of about 100° C. None of the currently known methods of applying thermal solutions are able to provide the requisite pressure on the processor, even during relatively brief periods of operation. Such inconsistent or inadequate pressure can, in turn, lead to excessive thermal resistance between the die and thermal solution, thus reducing the ability of the thermal solution to keep the components sufficiently cool. Without adequate cooling means, a processor can exceed the junction temperature specification, causing the processor operation to halt during testing, thus compromising future reliability of the processor.

For the reasons stated above, there is a need in the art for a simple, yet effective means for cooling high power processors.

DETAILED DESCRIPTION

Figure 1:
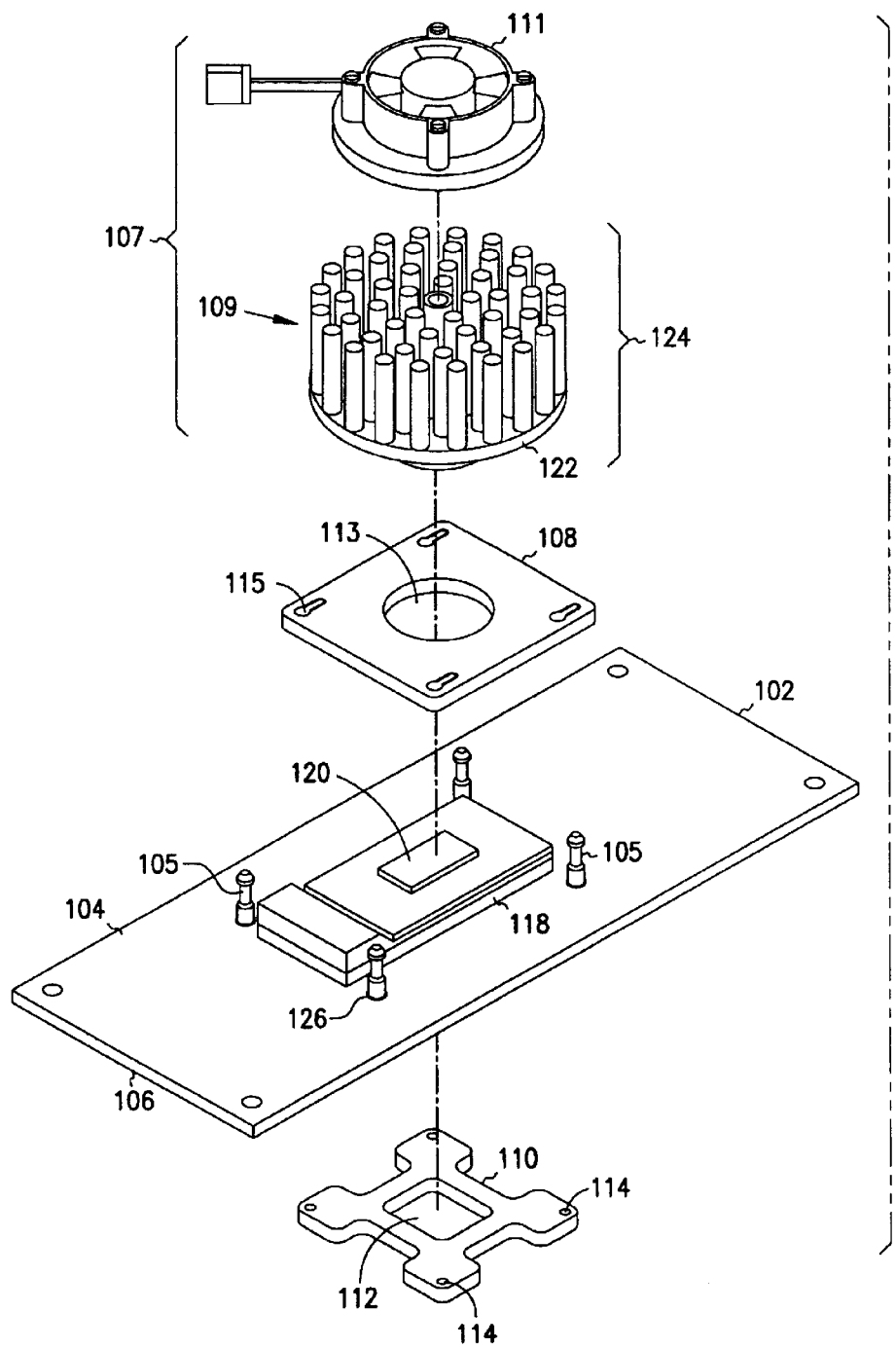
FIG. 1 is an exploded perspective view of a thermal solution attachment mechanism in one embodiment of the present invention.

In the following detailed description, reference is made to the accompanying drawings which form a part hereof, and in which is shown by way of illustration specific embodiments in which the inventions may be practiced. In the drawings, like numerals describe substantially similar components throughout the several views. These embodiments are described in sufficient detail to enable those skilled in the art to practice the invention. Other embodiments may be utilized and structural, logical, electrical, and other changes may be made without departing from the spirit and scope of the present invention. The following detailed description is, therefore, not to be taken in a limiting sense, and the scope of the present invention is defined only by the appended claims, along with the full scope of equivalents to which such claims are entitled.

A reusable thermal solution attachment system is described herein that provides a quick and easy method for securing and removing a thermal solution to a circuit board without the use of tape, adhesives or fasteners. In one embodiment, the system includes two plates and a set of connectors for securing the circuit board between the plates. The resulting mechanism is easy to attach and remove during testing operations and/or can be permanently installed in desktop environments.

FIG. 1 illustrates a reusable thermal solution attachment mechanism (hereinafter "attachment mechanism"). In one embodiment, the attachment mechanism is temporarily attached during manufacturing to a circuit board 102 having a top side 104 and a bottom side 106. The attachment mechanism comprises a non-adhesive thermal solution mounting plate (hereinafter "mounting plate") 108 having a mounting plate opening 113 into which a thermal solution (i.e., fansink) 107 is secured. In this embodiment, the thermal solution 107 comprises a heat sink 109 and a fan 111, although the invention is not so limited. In other embodiments, the thermal solution is a passive thermal solution and does not include a fan. Connectors, such as locking posts or pins 105 typically having heads, are designed to slide through slots 115 in the mounting plate 108 and serve to connect the mounting plate 108 and a backing or support plate 110 together. The backing plate 110 has a backing plate opening 112 to accommodate components on the back side 106 of the circuit board 102 and securing holes 114 for securing one end of each locking pin 105 in place. The backing plate 110 also provides rigid support for the circuit board 102, which is particularly useful for preventing flexure in relatively thin circuit boards during use.

Each component of the attachment mechanism can be any suitable size and shape, as long as the mechanism fits together properly to perform the intended function. In the embodiment shown in FIG. 1, the mechanism is designed to utilize existing through-holes, i.e., tooling holes 126 on the circuit board 102, although the invention is not so limited. In another embodiment, the attachment mechanism is designed to accommodate a range of sizes and types of circuit boards and thermal solutions. In yet another embodiment, the attachment mechanism is custom designed for any type of unique application.

In the embodiment shown in FIG. 1, the backing plate opening 112 in the backing plate 110 is large enough to accommodate a variety of components on the bottom side 106 of the circuit board 102. The backing plate opening 112 can be even larger in proportion to the backing plate 110, as long as material integrity is maintained. Additionally, the mounting plate opening 113 can also be varied to accommodate any type or size of thermal solution 109, as well as components on the top side 104 of the circuit board 102, again as long as material integrity is maintained.

As noted above, the circuit board 102 can be any type of circuit board, but in one embodiment is a relatively thin board subject to flexure (i.e., less than about 1.5 mm). Such circuit boards include the types used in mobile environments, e.g., laptop computers, which are generally less than about 1.2 mm in thickness. In another embodiment, the circuit board 102 is thicker and less subject to flexure (i.e., more than about 1.5 mm), and therefore less dependent (or not dependent) on the supporting or stiffening properties of the backing plate 110. (Desktop environments typically utilize circuit boards that are more than about two (2) mm.)

In the embodiment shown in FIG. 1, a socket 118 is connected to the top side 104 of the circuit board 102. The socket 118 can be connected to the circuit board 102 in any suitable manner, such as with female connectors that provide electrical paths between male connectors or pins and the circuit board 102. An integrated circuit package (hereinafter "package") 120 is connected to a top portion of the socket 118 in any suitable manner, such as with male/female connectors (not shown).

It will be appreciated that the integrated circuit package 120 can contain any type of integrated circuit or processor that produces heat. However, the present invention is particularly suited for processors used in the mobile environment that operate at high speeds and produce relatively large amounts of heat, such as about 30 watts or more near a temperature of about 100° C. The attachment mechanism can also be designed to accommodate relatively thick circuit boards having high-powered processors. In one embodiment, the attachment mechanism is utilized with processors used in a desktop environment, in which 50 to 60 watts of power is generated near a temperature of about 100° C.

In an alternative embodiment, not shown, the attachment mechanism of the present invention is used with a surface mount technology (SMT) package rather than a socketed package. However, since there is little or no clearance between an SMT package and the circuit board, modifications would need to be made in this embodiment in order to provide adequate clearance for the attachment mechanism.

Heat sink designs vary, and the present invention is not limited to any specific design. In general, the heat sink 109 shown in FIG. 1 is cylindrical in shape and includes a base or pedestal 122 and a heat dissipating region 124. The heat dissipating region 124 includes heat dissipation elements such as fins or rods that provide large surface areas for spreading heat. The base 122 can be designed to secure into the mounting plate 110, such as into the mounting plate opening 113, in any suitable manner. Any type of heat sink 109 can be used, although in the mobile environment, the size of the thermal solution 107, including the heat sink 109 is limited. In one embodiment, the heat dissipating region 124 consists of a silkscreened thermal interface material as is known in the art. In such an embodiment, the thermal solution 107 is an active cooling solution containing a thermal interface material that contacts the processor, which is located inside the package 120. Interface materials can be elastomer-type materials, as is known in the art, e.g., silicon fiberglass, silicon film, polyester fiberglass, etc., which can be used repeatedly without the need for reapplication and without leaving any residual material behind. As noted above, the thermal solution 107 of FIG. 1 further includes the fan 111, which provides air movement to increase the amount of heat dissipated over time.

Unlike methods that rely on the weight of the thermal solution or thermal tape and/or adhesives to provide the requisite pressure, use of the attachment mechanism of the present invention allows the user to reliably and easily provide the desired pressure to the processor. In this way, sufficient force is applied to ensure adequate cooling. Pressure can be applied to the processor by any suitable means. In one embodiment, the base 122 and mounting plate opening 113 are threaded such that the requisite pressure is obtained by engaging the two components, i.e., by screwing the base 122 of the thermal solution 107 into the corresponding threaded mounting plate opening 113 and tightening any desired amount in order to apply mechanical pressure to the processor. Use of the backing plate 110 prevents thin circuit boards from flexing and bending as pressure is being applied to the processor, further helping to maintain a consistent pressure on the processor. As a result, the heat sink 109 maintains thermal contact with the integrated circuit package 120. In a particular embodiment, the applied pressure is between about 345 and 483 kilopascals (kPa) (about 50 to 70 PSI). In another embodiment, the applied pressure is greater than about 483 kPa, such as about 552 to 690 kPa (about 80 to 100 PSI). In contrast, conventional thermal tape or adhesives are able to provide only up to about 207 kPa (about 30 PSI) variable pressure to a processor.

Upon applying the necessary pressure to the processor, the locking pins 105, which have been pre-positioned in the slots 115 of the mounting plate 108 are now fully locked in place in all directions. In high pressure embodiments or otherwise in any embodiment in which a particular predetermined pressure is desired and not obtainable through other means (e.g., See FIG. 5B), an adapter tool can be used in conjunction with any conventional type of torque-generating device. Any suitable type of adapter tool can be used. In one embodiment, the adapter tool varies according to the particular application. For example, with active cooling solutions, the tool can be designed to accommodate tooling holes present in the fan. With passive cooling solutions, the tool can be designed to engage openings present in the heatsink itself. In most embodiments, the adapter tool serves as a type of drill bit having one end that is securable in any type of conventional torque-generating device, such as a drill, with the other end having a type of flange or other configuration designed to engage features present on the type of thermal solution being used. In one embodiment, a predetermined amount of torque in units of force can be set or "dialed in" on the adapter tool (or the torque-generating device) with a "limiter" device. Since the amount of torque applied corresponds directly with the amount of applied pressure, the user is now able to set a maximum amount of pressure to be applied to the processor. In other embodiments, any type of pressure-applying means can be used, such as a C-clamp and so forth.

Figure 2:
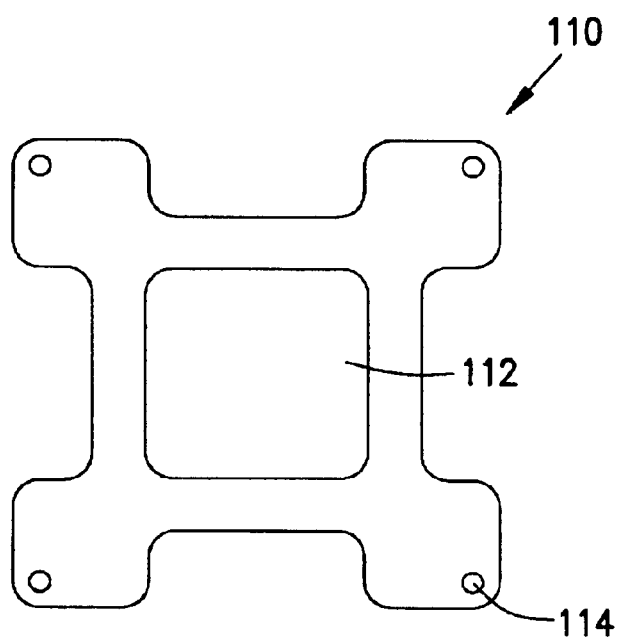
FIG. 2 is a plan view of a backing plate in the thermal solution attachment mechanism of FIG. 1 in one embodiment of the present invention.

FIG. 2 provides a more detailed illustration of one embodiment of the backing plate 110. The backing plate 110 can have any suitable configuration as long as it can provide the requisite support to the circuit board 102. In the embodiment shown herein, the backing plate 110 has a substantially square shape with enlarged corners to accommodate the mounting holes 114. In an alternative embodiment, the backing plate 110 has substantially straight edges on one or more sides, although in some embodiments, any net gain in added strength may be outweighed by increased material costs. As noted above, the backing plate 110 not only provides securing holes 114 for the locking pins 105 (FIG. 1), if not otherwise available on the circuit board itself, it also provides stiffening support for thinner circuit boards that are subject to flexure or for thicker boards that are subjected to particularly high pressures, e.g., boards thicker than about two (2) cm and subject to pressures in excess of about 690 kPa (about 100 PSI). In one embodiment, the backing plate 110 has the configuration shown in FIG. 2 and is about one (1) to 1.2 mm thick with the supporting holes located about 41 to 45 mm apart.

The backing plate opening 112 is designed to accommodate the circuit board configuration, and can be any size and shape. In the embodiment shown in FIG. 1, the backing plate opening 112 is substantially square, although the invention is not so limited. In other embodiments, the backing plate opening 112 is substantially rectangular, circular, oval-shaped or any other regular or irregular shape, as desired. In one embodiment, the backing plate opening is about 20 mm to 22 mm in length and width.

Material choice for the backing plate 110 is not limited to any particular material, but is preferably a "high strength" material, i.e., a material having a yield strength greater than about 145 MPa, although "moderate strength" materials having yield strengths of between about 125 MPa and 145 MPa can also be used. ("Yield strength" is generally defined as the point at which a material is no longer elastic, i.e., unable to return to its original shape after being compressed, stretched, deformed, etc.). Specifically, moderate strength materials are acceptable as long as there is minimal or no wear or creep associated with the locking pin/backing plate joint. In one embodiment the material is any type of suitable metal, such as aluminum or carbon steel. In a particular embodiment, Al 6061 aluminum, having a yield strength of about 145 MPa (about 19 KSI), is used. In another embodiment, stainless steel (AISI 302), having a yield strength of about 240 MPa (35 KSI), is used. In yet another embodiment, ½ hard carbon steel is used. Steels are typically more expensive than aluminum, but are known to have superior wear characteristics as compared with aluminum. In one embodiment, the material is hard-coat anodized as is known in the art to prevent electrical shorting of the metal to other components on the circuit board 102. The coating can be of any suitable thickness as long as there are no gaps or exposed metal areas that can contact and short an electrical component. In one embodiment, the coating is at least about 0.25 mm thick.

In another embodiment any suitable type of plastic is used, such as any type of high strength or medium strength plastic. In one embodiment, polyethylene terephthalate (PET) polymer plastic, a high strength plastic is used. In another embodiment, a PET polymer plastic having a glass content of about 10–15% and a yield strength of about 100 MPa (about 13 KSI), is used. In this embodiment, there is no need to hard-coat anodize the surface, as the use of plastic would eliminate any electrical shorting concerns.

Figure 9:
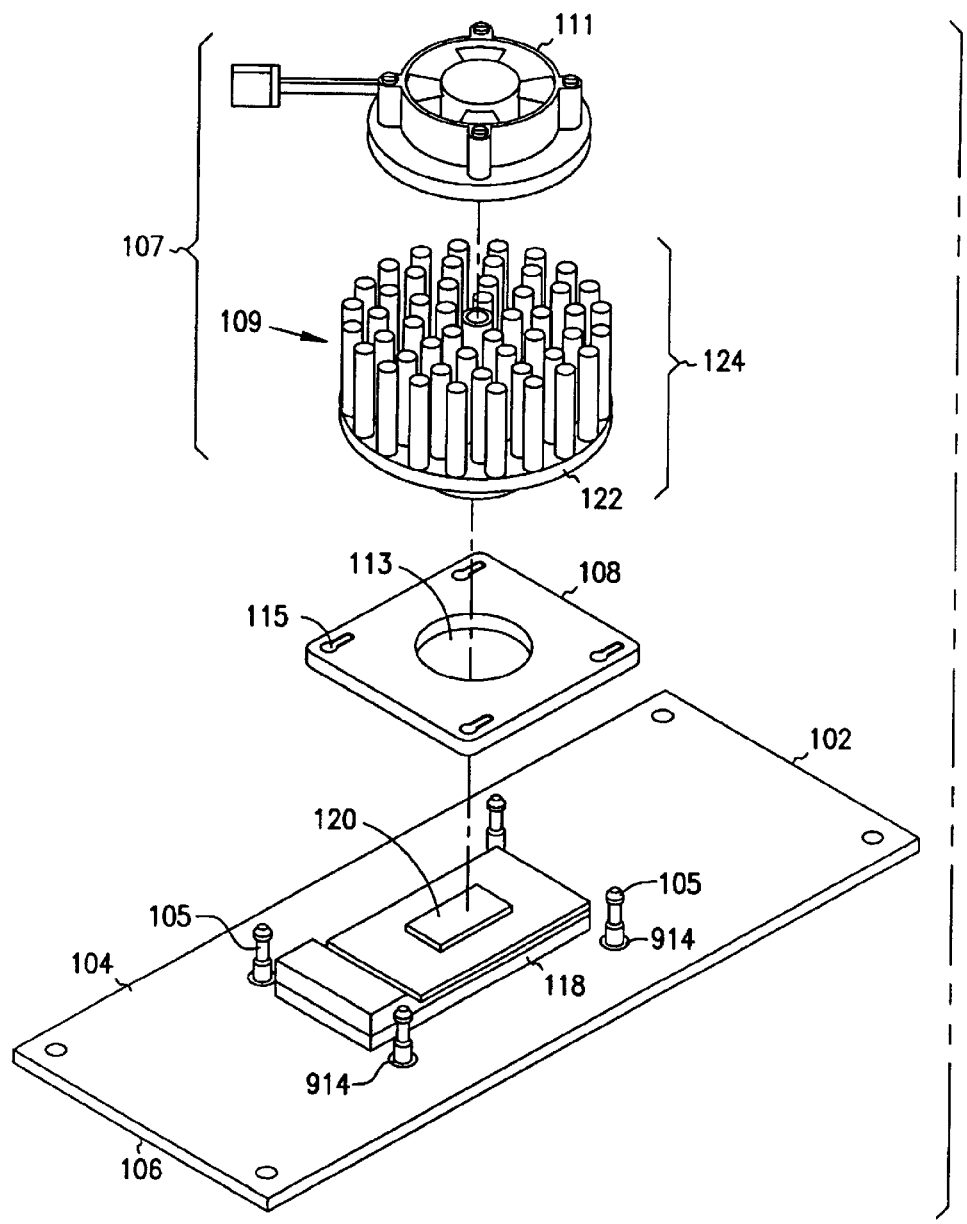
FIG. 9 is an exploded perspective view of an alternative thermal solution attachment mechanism in one embodiment of the present invention.

In an alternative embodiment, shown in FIG. 9 there is no backing plate and the attachment mechanism is used with a circuit board 102 at least about two (2) cm thick, such as the type of circuit board used in the desktop manufacturing test environment or in a hard mount permanent desktop setting. The securing holes 914 for the locking pins 105 in this embodiment are provided in the circuit board 102 itself. In yet another embodiment, there are no through holes on the circuit board, and any type of connecting means, such as hooks, screws, nuts and bolts, nails, and so forth, are used to secure the attachment mechanism to the processor.

In embodiments which do have a backing plate, any type of connector, including any of the aforementioned types of connectors can be used. In the embodiment described herein a "locking pin" is used as the connecting means. Referring again to FIG. 1, each locking pin 105 can be of any suitable configuration as long as the mounting plate 108 and preferably also the backing plate 110 is in contact with and provides the requisite pressure to the circuit board 102. The design of each locking pin 105 can be made specific to the size and location of the available tooling holes 126 located in the circuit board 102 being tested or used. In an alternative embodiment, additional holes are added to the circuit board 102 prior to using the attachment mechanism. The length of each locking pin 105 is also affected by the total number of boards stacked between the mounting plate 108 and backing plate 110, discussed in greater detail below.

Figure 3A:
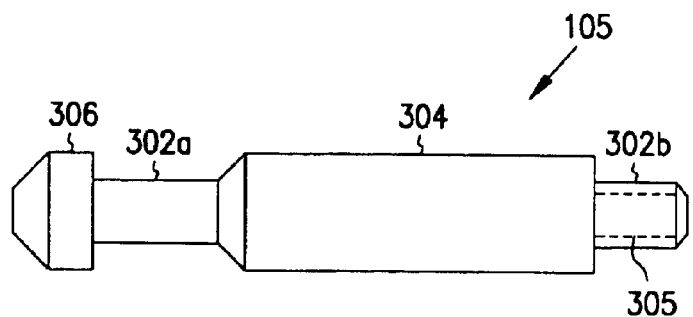
FIG. 3A is a plan view of a locking post in the thermal solution attachment mechanism of FIG. 1 in one embodiment of the present invention.

The particular type of locking pin 105 shown in FIG. 1 is illustrated more closely in FIG. 3A and includes a column having an upper portion 302*a* and a lower portion 302*b* as well as an extended lower boss 304 and an upper boss 306. The locking pins 105 of the present invention have the additional advantage of serving as locating features for the thermal solution 107, thus eliminating the need for any type of fastener. In the mobile environment, such fasteners can be particularly small and difficult to handle, such as a "metric-2" or (M-2) fastener or screw having a screw head diameter of approximately 2.2 millimeters (mm).

In the embodiment shown in FIG. 3A, the lower portion 302*b* of the column has threads 305 to engage with threads in the mounting holes 114 (FIG. 2), although the invention is not so limited. The upper portion 302a of the column is smaller in diameter than both bosses 304 and 306, thus allowing the locking pin 105 to slide within its respective slot on the mounting plate 108 during use (See FIG. 1). The larger diameter of the upper boss 306 is designed to glide or slide on the ridge or shelf 402 located inside each slot 115 (See FIG. 5A).

The lower and upper bosses 304 and 306, respectively, need only be sufficiently larger in diameter than the upper portion 302a of the column in order to perform their intended functions. In the embodiment shown in FIG. 3A, the lower boss 304 is relatively long as compared with the length of the upper portion 302a of the column, although the invention is not so limited. In one embodiment, the lower boss 304 has a length of between about six (6) and seven (7) mm. In this embodiment, the diameter of both the lower and upper bosses 304 and 306, respectively, can be between about two (2) and 2.2 mm. In such an embodiment, the length of the upper boss 306 can be between about 1.2 and 1.8 mm, such as about 1.5 mm. In this embodiment, in which the lower and upper bosses 304 and 306 have the given dimensions, the upper portion 302a of the column can have a length of between about three (3) and 3.5 mm and a diameter of between about 1.2 and 1.5 mm, while the threaded lower portion 302b can have a length of between about two (2) and 2.5 mm, with the same diameter as the upper portion 302a. In other embodiments, the boss 304 may be longer or shorter than the ranges given above. Generally, however, the diameter of the boss 304 will increase or decrease by about the same percentage, although the invention is not so limited. In one embodiment, the boss 304 is about ten (10) mm in length with a diameter of about 2.9 mm, i.e., an increase of about 43% in both dimensions as compared with a boss about seven (7) mm in length and a diameter of about two (2) mm.

As noted above, the embodiment of the locking pin 105 shown in FIG. 3A has a relatively "tall" configuration, which is typically used to accommodate two or more boards stacked together. For example, in the mobile environment, some applications utilize an interposer board that serves as a voltage regulator board. The interposer board is typically located above the primary circuit board such that the thermal solution is actually contacting a secondary integrated circuit package located on the interposer board.

Figure 3B:
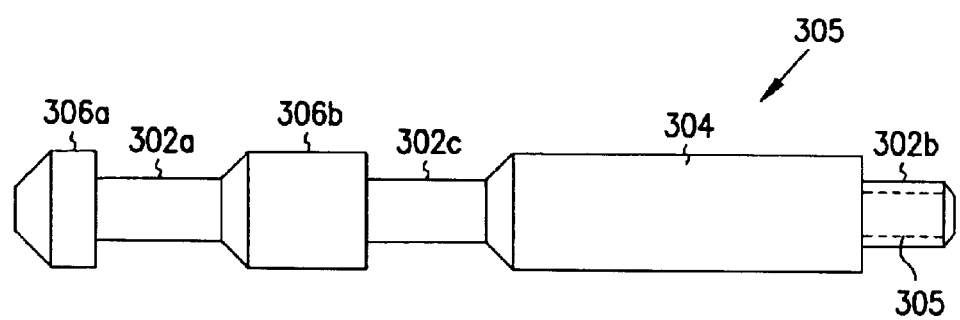
FIG. 3B is a plan view of an alternative locking post in one embodiment of the present invention.

The stacked board configuration can also be accommodated by locking pins 105 having multiple upper bosses. FIG. 3B shows one embodiment in which there are two upper bosses 306a and 306b, thus creating a middle portion 302c of the column. This type of locking pin 105 can also be used with a single board configuration, thus providing added convenience, since the same locking pin 115 can be used with a wide variety and number of circuit board arrangements. In yet another embodiment, discussed below in reference to FIG. 6B, the design of the mounting plate 108 itself can be altered to accommodate varying board thicknesses and/or multiple stack-up heights.

Figure 3C:
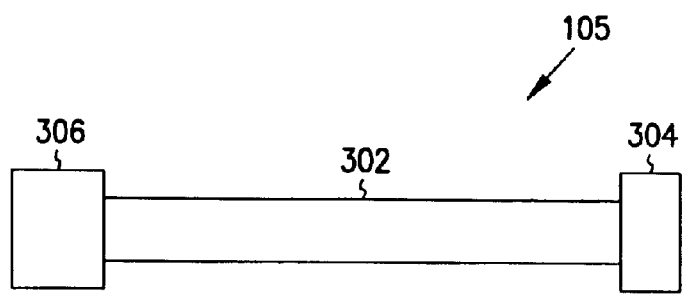
FIG. 3C is a plan view of another alternative locking post in one embodiment of the present invention.

FIG. 3C shows yet another embodiment of a locking pin having upper and lower bosses, 304 and 306, respectively, that are approximately the same length and diameter. In this embodiment, there is only a single portion 302 of column and there is no lower portion of the column that threads into the mounting holes 114 (not shown) as in the embodiments shown in FIGS. 3A and 3B.

The locking pins 105 can be secured in any suitable manner to the backing plate 110 as long as it remains secure during use. As noted above, the lower portion 302b can be threaded to engage threads in each mounting hole 114 (not shown). In another embodiment, the lower boss 304 can be press fit into each mounting hole. In addition to the above means, or in the alternative, each joint between the lower boss and mounting hole can be glued or spot welded.

The locking pins 105 can be made from any suitable material that provides the necessary tensile strength. In one embodiment, the locking pins 105 are made from aluminum or steel, such as A16061 aluminum or ½ hard carbon steel. In yet another embodiment, the locking pins 105 are made from any suitable type of plastic, such as the types discussed above with respect to the backing plate 102. Any suitable number of locking pins 105 can be used as long as the attachment mechanism can perform the intended function. In the embodiment shown in FIG. 1, four locking pins 105 are used. In an alternative embodiment, the backing plate 110 and mounting plate 108 are both more triangular in shape and three locking pins 105 are used. In another alternative embodiment, the backing plate 110 and/or the locking pins 105 are integrated into a bench top fixture.

Figure 4:
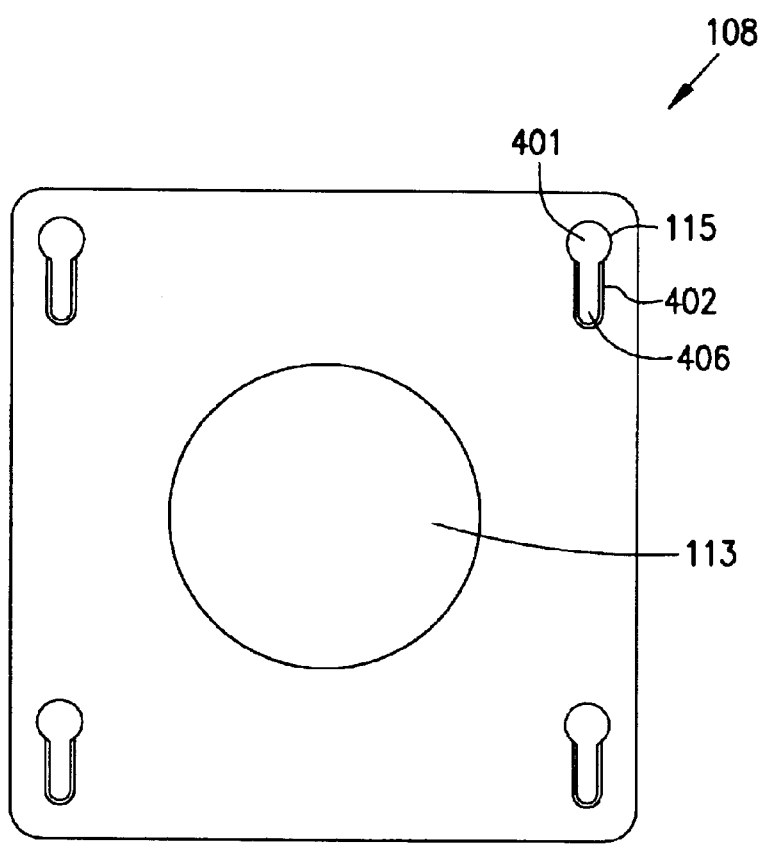
FIG. 4 is a plan view of a mounting plate having slots in the thermal solution attachment mechanism of FIG. 1 in one embodiment of the present invention.

Referring now to FIG. 4, the thermal solution mounting plate 108 can be seen in more detail. In this embodiment, the mounting plate slots 115 are essentially "keyhole-shaped" notches, each having an enlarged first end 401 for initially engaging the locking pin 105 and an opposing narrow end 406 into which the locking pin 105 slides, although any type of opening or slot can be used to secure any type of connector. In this embodiment, each slot 115 further contains a counter-bored slot that creates a shelf 402 to guide a locking pin 105 into place at the opposing narrow end 406.

The mounting plate 108 further comprises the mounting plate opening 113, which is designed to accommodate the integrated package 120 located on the top surface of the circuit board 102 (See FIG. 1). In the embodiment shown in FIG. 4, the mounting plate opening 113 is substantially circular, although the invention is not so limited. In other embodiments the mounting plate opening 113 is substantially rectangular, square, oval-shaped or any other regular or irregular shape. The actual size of the mounting plate opening 113 will vary, depending on the size of the processor as well as the size of the thermal solution base to be secured within. In one embodiment, the opening is substantially circular with a diameter of between about 20 and 26 mm. The overall size of the mounting plate 110 itself needs to be large enough to maintain material integrity. Factors to consider in determining the size of the mounting plate 110 include, but are not limited to, the size of the mounting plate opening 113, the pressures the mounting plate 100 will encounter during testing and/or use, the number of cycles it is to be reused for, etc. In this embodiment, the mounting plate 110 is a substantially square shape, as shown in FIG. 4. In a particular embodiment, the mounting plate 110 has a length and width of about 50 to 60 mm and a thickness of about two (2) to four (4) mm.

Material choices for the mounting plate 108 are similar to those described above for the backing plate 102 and locking pins 105 (See FIG. 1). In embodiments in which the mounting plate opening 113 and through-hole engagements, i.e., the slots 115, are expected to experience repeated use in the manufacturing test environment, however, the material selected should be able to maintain its integrity over thousands of cycles. In one embodiment, carbon steel is used, such as ½ hard carbon steel.

Figure 5A:
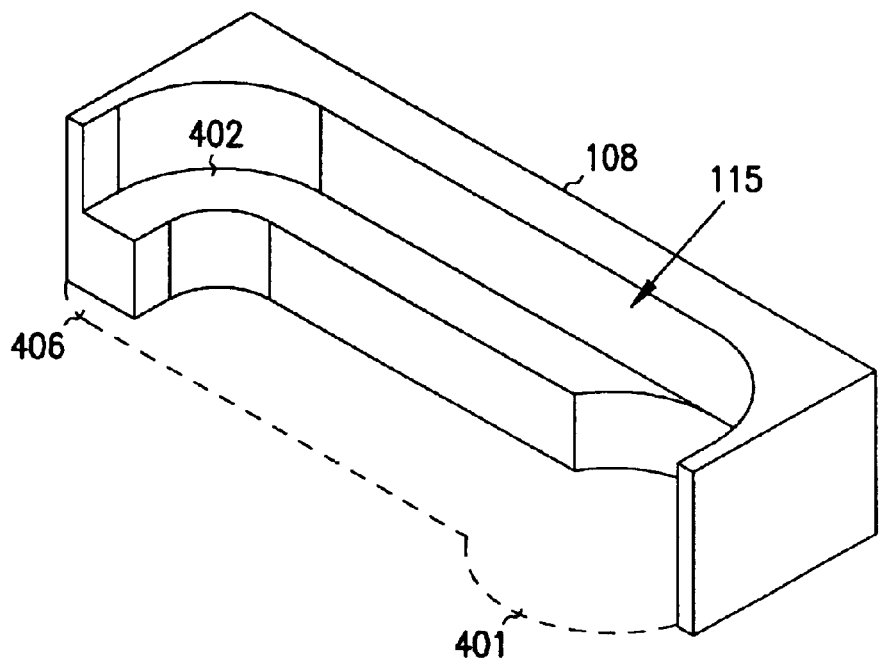
FIG. 5A is a cut-away perspective view of the slots in the mounting plate of FIG. 4 in one embodiment of the present invention.

FIG. 5A provides a cutaway view of the mounting plate slot 115. As noted above the slot 115 contains a counter-bored slot or shelf 402 along which the upper boss 306 of the locking pin 105 (not shown) can slide. In this embodiment the shelf 402 is substantially horizontal, although the invention is not so limited. During use, the locking pin slides substantially horizontally along the shelf 402 from the enlarged first end 401 to the opposing second end 406, thus allowing the mounting plate 108 to be properly positioned and locked into place above the integrated package 120 (See FIG. 1).

This horizontal "slide and lock" arrangement in one embodiment of the present invention, combined with the vertical tensional force on each locking pin that is created when the thermal solution is secured to the center opening of the mounting plate (e.g., screwed into place) ensures that the thermal solution will not move in either the planar or normal directions when fully engaged. However, as noted above, the mechanism can be removed quickly and easily, if reduced cycle time between tests is desired. The mechanism can then be repeatedly reused during testing of subsequent circuit boards.

Figure 5B:
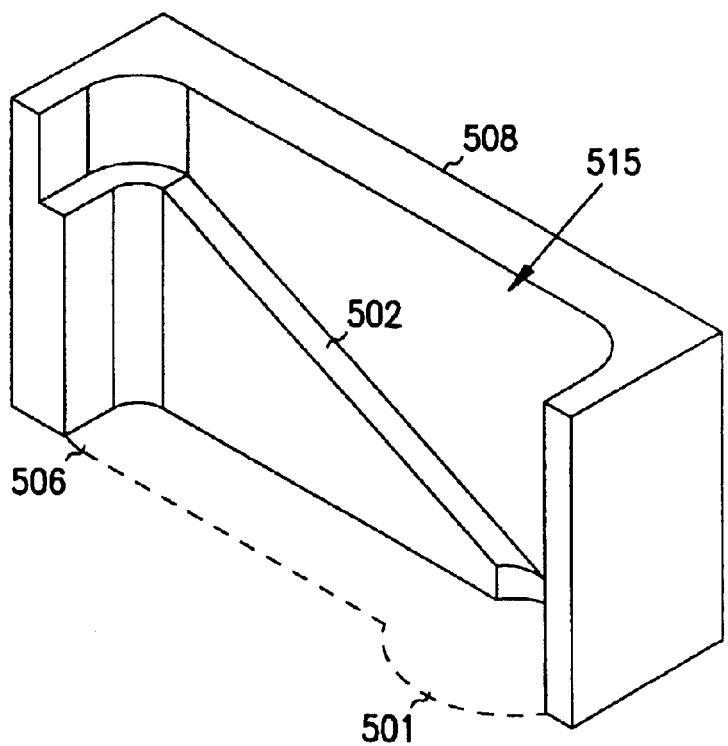
FIG. 5B is a cut-away perspective view of alternative slots in an alternative mounting plate in one embodiment of the present invention.

FIG. 5B shows an alternative mounting plate 508 having an alternative shelf 502. In this embodiment, the alternative mounting plate 508 may need to be made slightly thicker, as compared with the mounting plate 108 shown in FIG. 5A, in order to withstand the applied forces. In one embodiment, the alternative mounting plate 508 is about 100 to 115% larger, i.e., about seven (7) to 7.5 mm thick, as compared with a mounting plate having a substantially horizontal shelf 402. The angled sliding engagement shown in FIG. 5B is approximately 45 degrees, although the invention is not so limited. Any suitable angle can be used as long as the components are properly secured together. In this embodiment, the requisite tension or pressure to the processor is applied as the upper bosses of the locking pins 105 (not shown) are being slid into position along the alternate shelf 502. The applied pressure in this embodiment is dependent on the difference in height from one end of the alternate shelf 502 to the other. In one embodiment, the shelf is at an angle of about 45 degrees and has a length of about seven (7) to 7.5 mm, thus imparting a pressure to the processor of about 794 kPa (about 115 PSI). In this embodiment, the thermal solution can be hard-mounted to the mounting plate rather than being screwed into place, if desired, since there is no need to use torque to impart the requisite pressure.

Figure 6A:
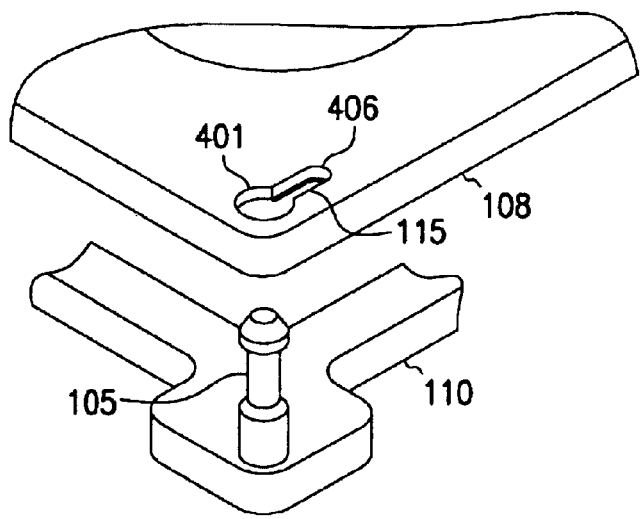
FIGS. 6A–6E are schematic illustrations showing a sequence of assembly steps for assembling the thermal solution attachment mechanism of FIG. 1 and securing a thermal solution thereon in one embodiment of the present invention.
Figure 6B:
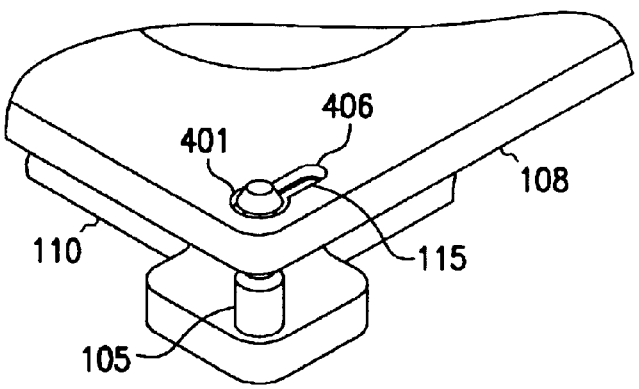
Figure 6C:
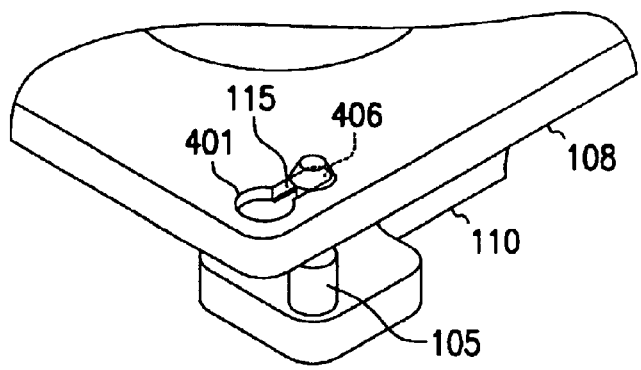
Figure 6D:
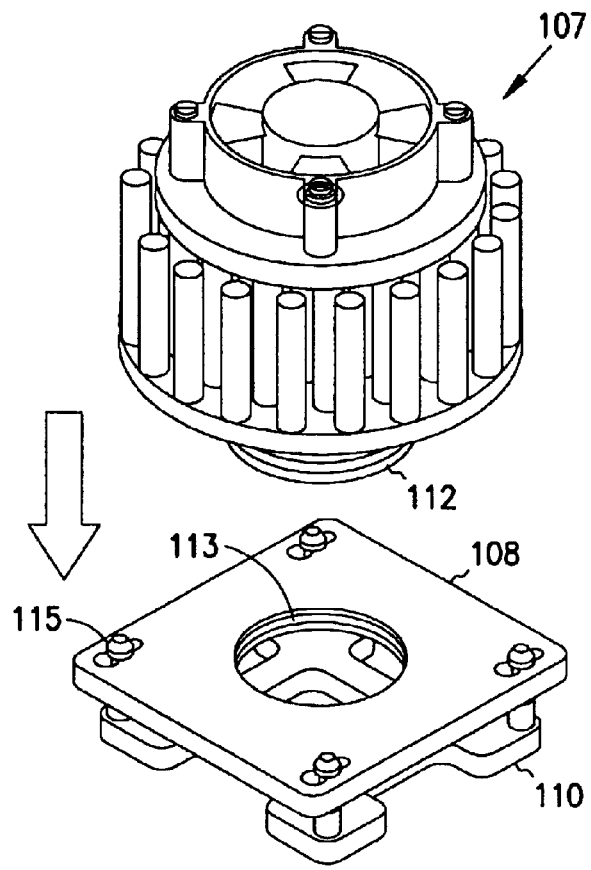
Figure 6E:
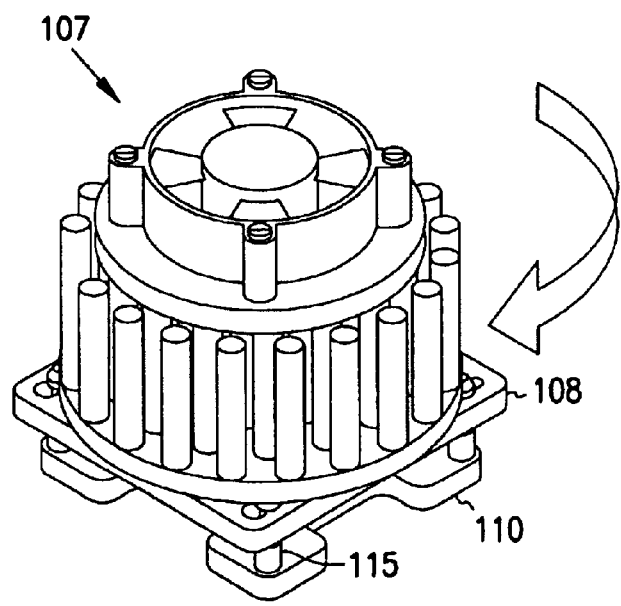

FIGS. 6A–6E provide simplified sequential views for assembling the thermal solution attachment mechanism and securing a thermal solution thereon in one embodiment of the present invention. In FIGS. 6A–6C, the insertion and positioning of an exemplary locking pin 105 within a slot 115 of the mounting plate 108 is shown. In use, all of the locking pins 105 are aligned and positioned simultaneously. FIGS. 6D–6E show the steps of inserting and engaging the thermal solution 107 into the attachment mechanism of the present invention. Referring again to FIG. 6A, the exemplary locking pin 105 has been aligned with the enlarged first end 401 in the mounting plate slot 115. In FIG. 6B, the locking pin 105 has been inserted into the enlarged first end 401 of the slot 115. In FIG. 6C, the locking pin 105 has been slid along the shelf 402 and is now locked into position at the opposing second end 406 of the slot 115. In FIG. 6D, the thermal solution 107 has been positioned above and is being inserted into the mounting plate opening 113. FIG. 6E shows the thermal solution 107 being screwed into place in the mounting plate opening 113, which, in this embodiment, is threaded. As a result, the locking pins 105 are now fully engaged and fixed in place in both the horizontal and vertical directions.

Figure 7:
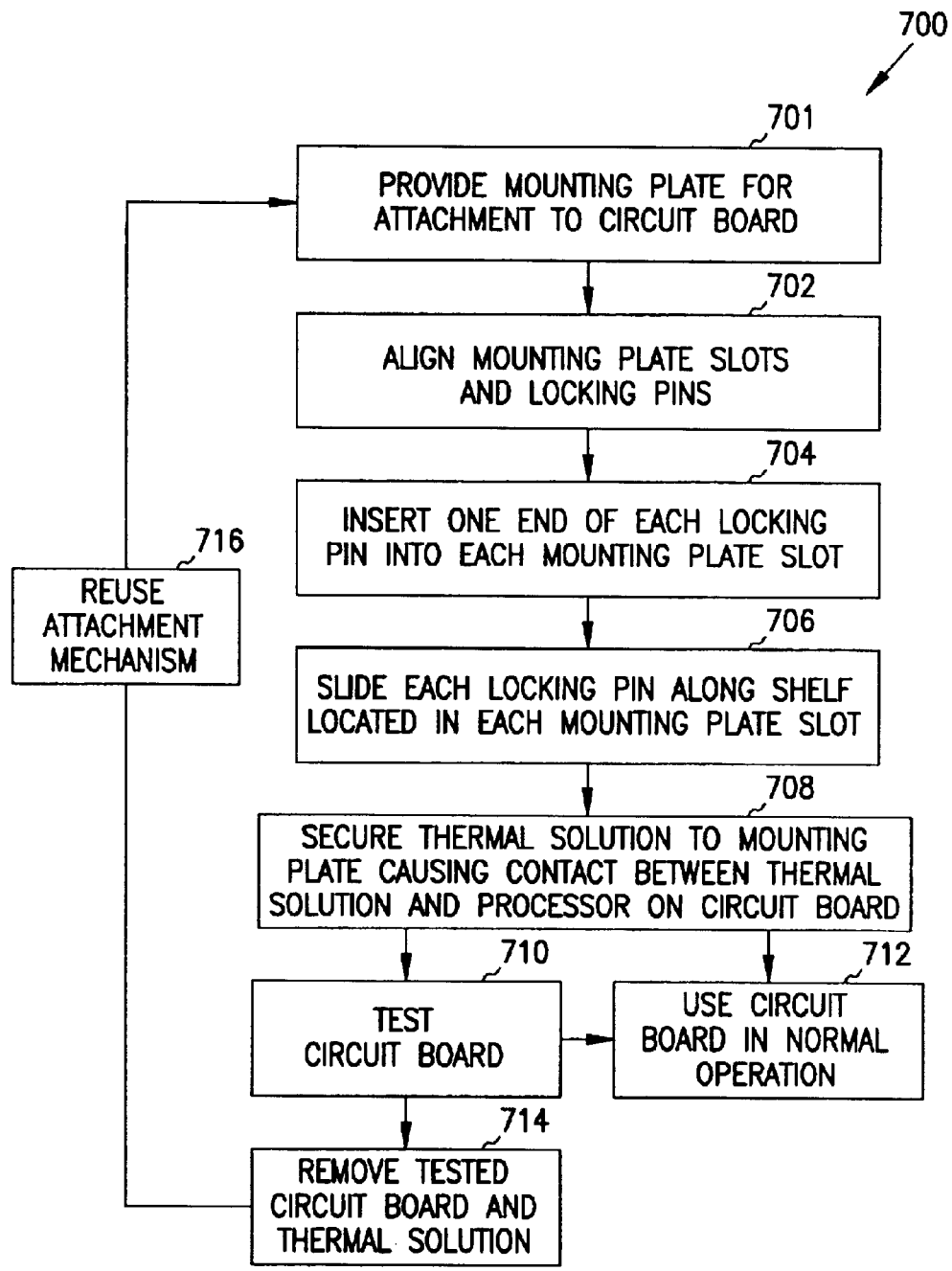
FIG. 7 is a block diagram of various methods for securing a thermal solution attach mechanism to a circuit board in one embodiment of the present invention.

FIG. 7 provides a block diagram for the process 700 of attaching a thermal solution to a circuit board according to one embodiment of the present invention. The process begins when a mounting plate is provided 701 for attachment to a circuit board. Mounting plate slots on the mounting plate and locking pins on the circuit board are then aligned 702. One end of each locking pin is inserted 704 into a mounting plate slot. Each locking pin is then slid 706 along a shelf located in each mounting plate slot. A thermal solution is then secured 708 to the mounting plate causing contact between the thermal solution and processor. In one embodiment, the process continues when the circuit board is then tested 710 during manufacturing. In another embodiment, the circuit board is instead used 712 in normal operation. In yet another embodiment, the circuit board is tested 710 and used 712 in normal operation (with the same attachment mechanism). If the circuit board is being tested 710, the tested circuit board and thermal solution can then be removed 714 and the attachment mechanism can be reused 716, repeatedly, as desired.

Figure 8:
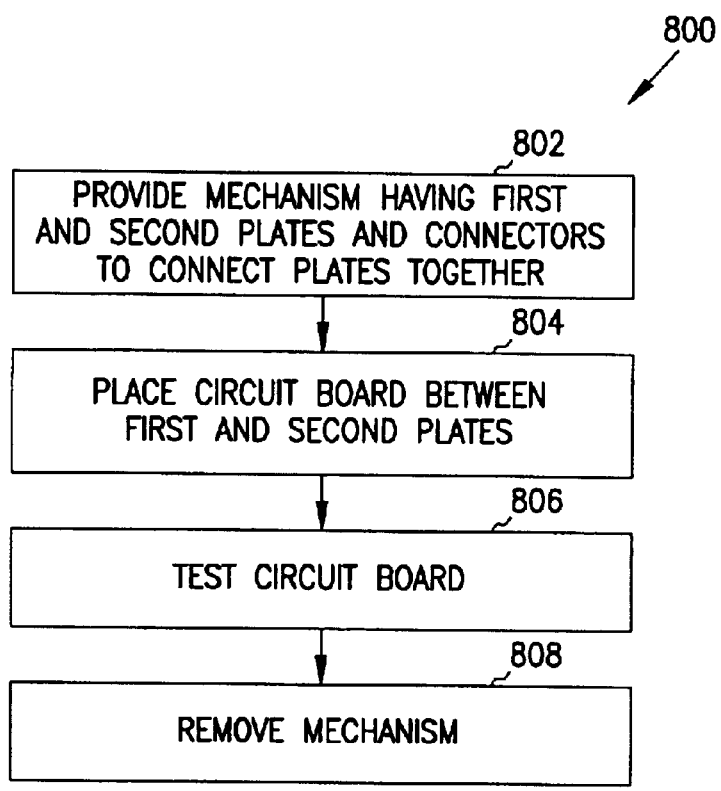
FIG. 8 is a block diagram of a method for temporarily attaching a thermal solution to a processor in one embodiment of the present invention.

FIG. 8 provides a block diagram for the process 800 of temporarily attaching a thermal solution to a circuit board according to one embodiment of the present invention. The process begins when a thermal solution attachment mechanism is provided 802, the mechanism having first and second plates and a set of connectors to connect the first and second plates together. A circuit board is then placed 804 between the first and second plates wherein a thermal solution secured to the first plate contacts a package located on the circuit board. The circuit board is then tested 806, wherein heat is removed by the thermal solution from a processor located in the package. The thermal solution attachment mechanism is then removed 804 from the circuit board.

Although the attachment mechanism has been described herein primarily as a testing device for any type and size of circuit board, the attachment mechanism of the present invention can be used to permanently secure a thermal solution in place on a circuit board, as noted above. Such embodiments necessarily must have the requisite space to allow the attachment mechanism to remain in place, such as desktop environments. Although the thermal solutions and circuit boards are typically larger in such environments, the attachment mechanism of the present invention can be modified, as noted above, to accommodate any size thermal solution and circuit board. Additionally, the thermal solution itself can be modified in any of the embodiments described herein to be used with the present invention. Use of the attachment mechanism of the present invention in a permanent environment replaces thermal solution fasteners and frames. Specifically, conventional desktop thermal solutions typically sit on a frame that screws into the circuit board. Although the frame serves to provide support to the circuit board, such frames are typically large and complex, taking up a great deal of space. Further, the frame is costly and difficult to manufacture. Thus, use of the attachment mechanism of the present invention eliminates these difficulties.

In yet another embodiment, as noted in FIG. 7, the same attachment mechanism can serve as both a testing platform and a permanent attachment mechanism for the thermal solution. This embodiment has the advantage of eliminating the need for a temporary thermal solution during testing, followed by replacement of another thermal solution that is hard mounted to the die with fasteners. The use of the same attachment mechanism for both testing and permanent use not only simplifies the testing and manufacturing process, it reduces the time and money required to manufacture circuit boards.

The system of the present invention provides, in one embodiment, a reusable apparatus for attaching a thermal solution to a circuit board comprising a non-adhesive mounting plate having a mounting plate opening designed to allow the thermal solution to contact a package on a top surface of the circuit board and a connector having a first end and a second end, the first end attachable to the non-adhesive mounting plate and the second end securable to the circuit board, the connector designed to keep the mounting plate in contact with the top surface of the circuit board during use.

The system of the present invention is more economical and efficient than known attachment means for thermal solutions. Since the attachment mechanism is so easily attached and removed, it can be offered as a high volume manufacturing (HVM) test platform product in both mobile and desktop environments. The mechanical attachment mechanism of the present invention also stays within "keep-out" zone guidelines currently in place for conventional thermal solutions, so there is no need to make major modifications to the manufacturing process, particularly when existing tooling holes in the circuit board are used. For the first time, processor cooling can be achieved in a HVM test environment for high power processors consistently and easily. By allowing the testing process to proceed faster, yet provide reliable results, manufacturing costs are reduced. Additionally, the mechanism can be used repeatedly, thus further reducing costs.

Unlike conventional methods that rely on the weight of the thermal solution or on tapes or adhesives, the attachment mechanism of the present invention increases thermal mechanical performance of the integrated package by applying direct, known and adequate pressure to the processor. The mechanism has the further advantage of not leaving any residue on the die surface. The attachment mechanism also protects the socket to circuit board junction in thin circuit boards subject to flexure through use of a backing or support plate. Use of an adaptor tool or other means to impart a predetermined and known pressure aids in optimizing the system.

In embodiments designed for varying sizes and/or numbers of circuit boards, e.g., having an angled shelf in the mounting plate slot and/or multiple upper bosses in the locking pins, manufacturing of different types of circuit boards can proceed quickly and in a cost-effective manner without the need to stop and change testing devices. The mechanism can also be permanently installed in desktop applications, thus replacing fasteners and adhesive-backed thermal solutions.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus for attaching a thermal solution to a circuit board comprising:
    a mounting plate having a mounting plate opening designed to allow the thermal solution to contact a processor, the processor located on the circuit board;
    a backing plate connectable to the mounting plate, the backing plate designed to prevent flexure of the circuit board; and
    a plurality of locking pins, each having a first end and a second end, the first end slideable within a slot in the mounting plate and the second end securable to the circuit board and to the backing plate, the plurality of locking pins capable of being aligned and positioned simultaneously, and designed to keep the mounting plate in contact with the processor.

2. The apparatus of claim 1 wherein the second end of each of the plurality of locking pins is insertable through an existing tooling hole in the circuit board.

3. The apparatus of claim 1 wherein there are four key-hole shaped slots in the mounting plate and corresponding locking pins insertable into the four key-hole shaped slots, each slot having a shelf along which the corresponding locking pin can slide.

4. The apparatus of claim 3 wherein each shelf is substantially horizontal or substantially angled.

5. The apparatus of claim 4 wherein the four corresponding locking pins have bosses slidable along the shelves.

6. The apparatus of claim 5 wherein the shelves are substantially horizontal and the thermal solution has a threaded base engageable with threads in the mounting plate opening.

7. The apparatus of claim 6 wherein pressure on the processor increases as the thermal solution is screwed into the mounting plate opening, further wherein thermal resistance between the processor and thermal solution is reduced.

8. The apparatus of claim 7 further comprising using a torque driver to screw the thermal solution into the mounting plate opening, wherein a predetermined amount of pressure can be imparted to the processor.

9. The apparatus of claim 8 wherein about 345 to 690 kPa of pressure is imparted to the processor after the thermal solution has been screwed into the mounting plate opening.

10. The apparatus of claim 5 wherein the shelves are substantially angled and wherein pressure on the processor increases as the locking pins slide along the shelves in a downwardly direction.

11. The apparatus of claim 10 wherein about 345 to 690 kPa of pressure is imparted to the processor after the locking pins have been slid along the shelves.

12. The apparatus of claim 1 wherein the apparatus attaches the thermal solution to the circuit board temporarily during testing.

13. The apparatus of claim 12 wherein the circuit board is less than 1.5 mm in thickness and 30 watts of power is removable by the thermal solution near a temperature of about 1000° C.

14. The apparatus of claim 12 wherein the circuit board is greater than 1.5 mm in thickness and about 50 or more watts of power is removable by the thermal solution near a temperature of about 1000° C.

15. The apparatus of claim 1 wherein the circuit board is greater than about 1.5 mm in thickness and the apparatus is used to permanently attach the thermal solution to the circuit board.

16. The apparatus of claim 1 wherein the mounting plate, backing plate and connector are each made from a material selected from the group consisting of aluminum, steel and plastic.

17. A removable thermal solution attachment mechanism comprising:
    a mounting plate having a mounting plate opening designed to allow the thermal solution to contact a processor located in a package;
    a backing plate designed to connect to the mounting plate; and
    a plurality of locking pins securable to the backing plate, each locking pin having one or more bosses insertable into slots in the mounting plate, each slot having a substantially horizontal shelf, the plurality of locking pins capable of being aligned and positioned in the slots simultaneously, wherein the thermal solution imparts a force on the package when secured to the mounting plate opening, further wherein the thermal solution can remove heat from the processor.

18. The mechanism of claim 17 wherein the thermal solution is an active or passive thermal solution.

19. The mechanism of claim 17 wherein the package is a socketed package securable to a circuit board.

20. The mechanism of claim 17 wherein the backing plate and connectors are integrated into a bench top fixture.

21. A method for attaching a thermal solution to a circuit board comprising:

placing a mounting plate on top of a processor, the processor located on a top surface of the circuit board and the mounting plate having a mounting plate opening designed to allow the thermal solution to contact a processor;

simultaneously aligning slots on the mounting plate with locking pins securable to the circuit board;

providing a backing plate designed to give support to the circuit board, the locking pins also securable to the backing plate;

simultaneously inserting one end of each locking pin into each mounting plate slot;

simultaneously sliding each locking pin along a shelf located in each mounting plate slot; and securing a thermal solution to the mounting plate.

22. The method of claim 21 further comprising:

testing the circuit board;

removing the attachment mechanism from the circuit board; and reusing the attachment mechanism with another circuit board.

23. The method of claim 21 further comprising using the circuit board in normal operation, wherein the attachment mechanism is used to permanently attach the thermal solution to the circuit board.

24. A method for temporarily attaching a thermal solution to a circuit board comprising:

providing a thermal solution attachment mechanism having first and second plates and a set of connectors to connect the first and second plates together;

placing a circuit board between the first and second plates;

simultaneously inserting the set of connectors into slots on the first plate:

simultaneously sliding the set of connectors along shelves located in the slots, wherein the first and second plates are connected;

securing a thermal solution to an opening in the first plate wherein the thermal solution contacts a package located on the circuit board;

testing the circuit board, wherein heat is removed by the thermal solution from a processor located in the package; and removing the thermal solution attachment mechanism from the circuit board.

25. The method of claim 24 further comprising reusing the thermal solution attachment mechanism on another circuit board.

26. The method of claim 25 wherein the shelves are substantially horizontal and pressure is applied to the processor by securing the thermal solution to the opening.

27. The method of claim 24 wherein the shelves are substantially angled and pressure is applied to the processor by sliding the set of connectors along the substantially angled shelves in a downwardly direction.

28. An apparatus comprising:

a mounting plate having a mounting plate opening designed to allow a thermal solution to contact a processor, the processor located on a circuit board, wherein the circuit board is greater than about 1.5 mm in thickness; and four locking pins designed to keep the mounting plate in contact with the processor, each locking pin having a first end and a second end, the first end of each locking pin simultaneously securable to a corresponding key-hole shaped slot in the mounting plate, wherein each key-hole shaped slot has a shelf along which the locking pin can slide, the second end of each locking pin securable to the circuit board.

29. The apparatus of claim 28 wherein the thermal solution has a threaded base engageable with threads in the mounting plate opening.

30. The apparatus of claim 28 wherein about 50 or more watts of power is removable by the thermal solution near a temperature of about 100° C.

31. The apparatus of claim 28 wherein the apparatus attaches the thermal solution to the circuit board temporarily during testing.

32. A removable thermal solution attachment mechanism comprising:

a mounting plate having a mounting plate opening designed to allow the thermal solution to contact a processor located in a package;

a backing plate designed to connect to the mounting plate; and a plurality of locking pins securable to the backing plate, each locking pin having one or more bosses insertable into slots in the mounting plate, each slot having a substantially angled shelf with a top and bottom, the plurality of locking pins capable of being aligned and positioned in the slots simultaneously, wherein the plurality of locking pins can impart a force on the package.

33. The mechanism of claim 32 wherein pressure on the package increases as the plurality of locking pins are slid along the angled shelves in a downwardly direction.

34. The apparatus of claim 32 wherein about 345 to 690 kPa of pressure is imparted to the package when the locking pins are secured in place at the bottom of the angled shelves.

35. The apparatus of claim 32 wherein the thermal solution is hard mounted to the mounting plate.

36. The apparatus of claim 32 where up to about 800 kPa of pressure is imparted to the processor when the locking pins are secured in place at the bottom of the angled shelves.

37. The apparatus of claim 36 wherein each angled shelf is at an angle of about 45 degrees.

38. The apparatus of claim 21 wherein the slots have substantially horizontal shelves and the thermal solution has a threaded base engageable with threads in the mounting plate opening, wherein increasing pressure is applied to a package secured to the processor as the thermal solution is being screwed into the mounting plate opening, the package located beneath the thermal solution.

39. The apparatus of claim 21 wherein the slots have substantially angled shelves and increasing pressure is applied to a package secured to the processor as the locking pins are being slid along the shelves in a downwardly direction, the package located beneath the thermal solution.

40. The apparatus of claim 1 wherein the thermal solution contacts the processor indirectly.

41. The apparatus of claim 40 wherein an interposer board is located between the processor and the thermal solution and the thermal solution is in direct contact with a secondary processor located on the interposer board.

* * * * *

UNITED STATES PATENT AND TRADEMARK OFFICE
CERTIFICATE OF CORRECTION

PATENT NO. : 6,741,470 B2
DATED : May 25, 2004
INVENTOR(S) : Isenburg

It is certified that error appears in the above-identified patent and that said Letters Patent is hereby corrected as shown below:

<u>Column 12,</u>
Line 9, after "and" insert -- four --.
Lines 45 and 49, delete "1000°" and insert -- 100° --, therefor.

<u>Column 13,</u>
Line 50, delete ":" and insert -- ; --, therefor.

Signed and Sealed this

Sixteenth Day of August, 2005

JON W. DUDAS
*Director of the United States Patent and Trademark Office*